(12) United States Patent
Ben Jamaa et al.

(10) Patent No.: US 9,915,683 B2
(45) Date of Patent: Mar. 13, 2018

(54) ELECTRICAL CONNECTION DEVICE COMPRISING CONNECTION ELEMENTS WITH CONTROLLABLE POSITION

(71) Applicant: Commissariat a L'Energie Atomique et aux Energies Alternatives, Paris (FR)

(72) Inventors: Haykel Ben Jamaa, Grenoble (FR); Patrice Rey, St. Jean de Morians (FR)

(73) Assignee: Commissariat à l'énergie atomique et aux énergies alternatives, Paris (FR)

( * ) Notice: Subject to any disclaimer, the term of this patent is extended or adjusted under 35 U.S.C. 154(b) by 307 days.

(21) Appl. No.: 14/737,761

(22) Filed: Jun. 12, 2015

(65) Prior Publication Data

US 2015/0369843 A1 Dec. 24, 2015

(30) Foreign Application Priority Data

Jun. 24, 2014 (FR) ...................... 14 55858

(51) Int. Cl.
*G01R 31/20* (2006.01)
*G01R 1/073* (2006.01)
(Continued)

(52) U.S. Cl.
CPC ..... *G01R 1/07364* (2013.01); *G01R 1/06727* (2013.01); *G01R 3/00* (2013.01);
(Continued)

(58) Field of Classification Search
CPC ........................... G01R 1/408; G01R 31/2601; G01R 31/2891; G01R 31/2894; G01R 31/2887; G01R 31/02
See application file for complete search history.

(56) References Cited

U.S. PATENT DOCUMENTS 4,697,118 A 9/1987 Harnden, Jr. et al.
4,862,077 A 8/1989 Horel et al.
(Continued)

OTHER PUBLICATIONS

U.S. Appl. No. 14/745,783, filed Jun. 22, 2015, Ben Jamaa.
(Continued)

*Primary Examiner* — Tung X Nguyen
*Assistant Examiner* — Dominic Hawkins
(74) *Attorney, Agent, or Firm* — Oblon, McClelland, Maier & Neustadt, L.L.P.

(57) ABSTRACT

Electrical connection device comprising at least one substrate and one or several first electrical connection elements located on a front face of the electrical connection device such that they can be coupled to contact pads of an electronic device to which the electrical connection device is intended to be connected, each first electrical connection element comprising:

at least one support, of which at least one first end is anchored to the substrate such that part of the support is suspended above the front face, the support comprising at least a portion of piezoelectric material located between two electrodes and capable of moving said part of the support in two directions approximately perpendicular to the front face depending on a value of an electrical voltage intended to be applied onto the electrodes;

at least one electrical conducting element located on said part of the support.

15 Claims, 7 Drawing Sheets

(51) Int. Cl.
*H01H 57/00* (2006.01)
*G01R 3/00* (2006.01)
*G01R 1/067* (2006.01)
*H01L 41/09* (2006.01)

(52) U.S. Cl.
CPC .......... *H01H 57/00* (2013.01); *H01L 41/094* (2013.01); *G01R 1/06738* (2013.01); *G01R 1/06761* (2013.01); *Y10T 29/43* (2015.01)

(56) References Cited

U.S. PATENT DOCUMENTS

| | | | |
|---|---|---|---|
| 5,268,571 A | 12/1993 | Yamamoto et al. | |
| 5,736,850 A | 4/1998 | Legal | |
| 2001/0030061 A1* | 10/2001 | Yoneda | H01L 23/49822 174/260 |
| 2005/0146401 A1* | 7/2005 | Tilmans | H03H 9/02102 333/187 |
| 2005/0242687 A1 | 11/2005 | Kawakubo et al. | |
| 2006/0170435 A1 | 8/2006 | Granicher et al. | |
| 2009/0085432 A1 | 4/2009 | Liu | |
| 2009/0133917 A1* | 5/2009 | Horiuchi | H01L 23/49822 174/261 |
| 2010/0058499 A1* | 3/2010 | Shigeno | B82Y 35/00 850/21 |
| 2010/0148814 A1* | 6/2010 | Yalei | G01R 31/2891 324/750.22 |
| 2010/0252937 A1* | 10/2010 | Uchiyama | H01L 21/486 257/777 |
| 2010/0264934 A1* | 10/2010 | Inoue | G11B 5/5552 324/537 |
| 2011/0050262 A1* | 3/2011 | Chen | G01R 31/2891 324/754.27 |
| 2012/0206015 A1* | 8/2012 | Choy | H03H 9/02118 310/335 |
| 2012/0235762 A1* | 9/2012 | Ii | H03H 9/177 331/158 |
| 2012/0252166 A1* | 10/2012 | Koyanagi | H01L 21/561 438/109 |
| 2013/0321016 A1* | 12/2013 | Hirakawa | G01R 1/06794 324/755.01 |
| 2014/0318906 A1 | 10/2014 | Deimerly et al. | |
| 2014/0331770 A1 | 11/2014 | Jourdan et al. | |
| 2015/0115973 A1 | 4/2015 | Ben Jamaa | |

OTHER PUBLICATIONS

French Preliminary Search Report dated Feb. 23, 2015 in French Application 14 55858, filed on Jun. 24, 2014 (with English Translation of Categories of Cited Documents).

Yanwei Zhang et al. "Thermally Actuated Microprobes for a New Wafer Probe Card" IEEE Journal of Microelectromechanical Systems, vol. 8, No. 1, Mar. 1999, 7 pages.

* cited by examiner

ELECTRICAL CONNECTION DEVICE COMPRISING CONNECTION ELEMENTS WITH CONTROLLABLE POSITION

TECHNICAL FIELD AND PRIOR ART

The invention relates to an electrical connection device comprising electrical connection elements for which the position can be configured individually, and a method of making such an electrical connection device. The invention is advantageously applicable to manufacturing a test board used to test an electronic device or circuit comprising contact pads, at least some of which are intended to be contacted by the electrical connection elements of the electrical connection device forming the test board.

In the field of electronic device tests, and particularly when the contact pads of a device to be tested are made with a small pitch (for example less than about 100 µm), electrical connection devices made in the form of small pitch probe cards are used. Such probe cards are usually used only for the devices that are intended to be tested. Thus, the probes in such a board are arranged to match the contact pads of the device to be tested by this board.

One difficulty lies in adapting the probe card as a function of the positions of the contact pads of the device to be tested that can change during the design phase of the device, thus generating additional expensive phases for designing and manufacturing probe cards adapted to these new configurations of the tested device. A generic and reconfigurable probe card would thus be useful to solve this problem and reduce the cycle time and costs of the tested final product.

Document U.S. Pat. No. 4,862,077 discloses one solution in which the reconfigurability of the probes is achieved by a removable mechanical adaptor. There is a different model of mechanical adaptor for each reconfigurability pattern. However, such a system requires a new adaptor every time that the tested device is modified. Furthermore, such a test device is cumbersome due to the mechanical system used.

Documents U.S. Pat. No. 5,736,850 and US 2006/0170435 A1 disclose solutions in which the probes themselves cannot be reconfigured but for which the electrical connections connected to the probes can be reconfigured such that a reconfigurable connections matrix is made. Such solutions add some flexibility to the system but mechanically, all the probes remain in physical contact with the tested device. However this is not desirable because it increases the risk of damage to the tested device because the contact pads are fragile, particularly when they are made with a small pitch.

The document entitled "Thermally Actuated Microprobes for a New Wafer Probe Card" by Y. Zhang et al., IEEE Journal of micromechanical systems. Vol. 8, No. 1, March 1999, pages 43-49, describes how test probes can be used, the position of each of which can be configured by means of a bimetallic strip. The bimetallic strips are made in the form of beams incorporating a heating element to thermally control the position of the bimetallic strips. The probes are located at the ends of the beams. When one of the bimetallic strips is not heated, the probe associated with this bimetallic strip is then in a rest position, in other words in a position in which the probe will no longer come into contact with one of the contact pads of the tested device. When the bimetallic strip is heated, it becomes curved and causes a displacement of the probe towards the contact pad that is opposite the probe.

Unlike previous solutions, this solution has the advantage that probes that are not used during a test are not necessarily in contact with the contact pads of the tested device. However, to be controlled, the bimetallic strips require some heating resistance that implies that beams should be made with a relatively large area which is a problem if the device to be tested comprises contact pads made at a small pitch (for example less than about 100 µm). Furthermore, thermal control of the position of the probes is unstable because it is dependent on the temperature of the environment in which the probe card is located (in other words convection conditions in the test chamber or in the room in which the test equipment is located), and it is then affected by temperature conditions that are poorly controlled and frequently cannot be reproduced. Thus, for example the use of the probe card in a high temperature environment can cause parasite contacts of some probes with contact pads although these probes should normally be in the rest position and therefore not in contact with the pads. Finally, parasite contacts can also occur due to the fact the probe card and/or the tested device are not perfectly plane, or due to differences in thickness, geometry and materials between the contact pads in the tested device and/or between the probes.

PRESENTATION OF THE INVENTION

Thus there is a need to propose an electrical connection device comprising electrical connection elements for which the position can be individually configured, and that does not have any of the disadvantages of solutions according to prior art described above.

To achieve this, one embodiment discloses an electrical connection device comprising at least one substrate and one or several first electrical connection elements located on a front face of the electrical connection device, each first electrical connection element comprising:

at least one support, of which at least one first end is anchored to the substrate such that part of the support is suspended above the front face, the support comprising at least one portion of piezoelectric material located between two electrodes and capable of moving said part of the support in two directions approximately perpendicular to the front face depending on a value of an electrical voltage intended to be applied onto the electrodes;

at least one electrical conducting element located on said part of the support.

Thus, the position of each of the first electrical connection elements can be configured individually so that the position of each of the first electrical connection elements can be adapted, for example as a function of the configuration of the contact pads of the electronic device with which an electrical contact is required. It is thus possible to choose which of the first electrical connection elements are in contact with the tested device.

Furthermore, unlike the case of probes for which the position is controlled by bimetallic strips, the use of an electrically controllable piezoelectric material makes it feasible to produce the first electrical connection elements with a small pitch (for example less than about 100 µm or 40 µm, or between about 20 µm and 40 µm, or even with a pitch smaller than about 20 µm). The use of a piezoelectric material to control the position of the first electrical connection elements can also prevent the temperature of the operating environment of the device from having any influence on the position of the first electrical connection elements.

Furthermore, because the displacement is two-directional (which cannot be achieved with a bimetallic strip that can only curve in a single direction), it is possible for example to position each of the first electrical connection elements in at least three positions: a first position called the rest position when no polarization voltage is applied to the terminals of the electrodes, a second so-called contact position in which the electrically conducting element is moved towards the tested device, and a third so-called retracted position in which the electrically conducting element is moved towards the front face of the connection device thus increasing the distance between the electrically conducting element and the tested device. However, a retracted position in which some of the electrical connection elements can be moved away from the tested device cannot be obtained by using a bimetallic strip as disclosed in prior art. Thus, the electrical connection device avoids parasite contacts of some electrical contact elements with the tested device.

The first electrical connection elements may be such that they can be coupled to contact pads of an electronic device with which the electrical connection device is intended to come into contact. The contact pads of the electronic device are mechanically independent of the electrical connection device.

The first electrical connection elements may be arranged according to a matrix with a pitch of less than about 100 μm.

The support of each first electrical connection element may be elongated in shape and extend in a direction approximately parallel to the front face.

The electrically conducting element in each first electrical connection element may be located at a second end of the support suspended above the front face.

As a variant, a second end of the support may be anchored to the substrate in each first electrical connection element, said part of the support suspended above the front face possibly being located between the first and second ends of the support.

Each electrically conducting element may comprise at least one portion of electrically conducting material of which one end forms one or several probes, each probe possibly being rounded or plane or pointed. In general, the shape of the electrically conducting elements may be adapted as a function of the geometry and the materials of the contact pads of the device to be tested by the electrical connection device. The electrical connection device may form a probe card.

A shape is said to be rounded when it is in the form of a portion of a sphere such as a hemisphere, or when it is rounded. Unlike a rounded shape, a shape is said to be plane when it is defined in a plane.

The support for each first electrical connection element may also comprise at least one anchor portion such that a first of the two electrodes is located between said anchor portion and the portion of piezoelectric material, the anchor portion anchoring the support to the substrate.

The support of each first electrical connection element may comprise at least one electrically conducting portion on which the electrically conducting element may be located. Such an electrically conducting portion can be used to transmit signals from and/or to electrically conducting elements intended to come into contact with the tested device.

In this case, the support for each first electrical connection element may also comprise at least one dielectric portion located between the electrically conducting portion and a second of the two electrodes. This dielectric portion can thus create the electrical insulation between the electrically conducting portion and a second electrode of the two electrodes.

The electrical connection device may also comprise at least one electrically conducting via passing through the substrate and connected to the electrically conducting portion of the support of each first electrical connection element and to at least one second electrical connection element located on a back face of the electrical connection device. Such vias can form electrical connections between the front face and the back face of the electrical connection device. A test interface may be coupled to the back face of the electrical connection device, through the second electrical connection elements.

The electrically conducting portion of the support of each first electrical connection element may form a cover of at least one cavity located in the support, the electrically conducting element possibly being located above the cavity. Such a configuration can give good mechanical flexibility to the first electrical connection elements when these elements are brought into contact with contact pads of the tested device.

The electrical connection device may also comprise:
several dielectric layers superposed and arranged on the substrate and forming the front face of the electrical connection device,
several electrical interconnection layers located in the dielectric layers and to which at least the electrodes of each first electrical connection element are connected.

The electrical connection device may also comprise at least one memory capable of storing the value of the electrical voltage intended to be applied to the electrodes of each first electrical connection element.

Another embodiment relates to a method for making an electrical connection device comprising the production of one or several first electrical connection elements from a substrate on a front face of the electrical connection device at least through the following steps:
production of at least one portion of sacrificial material on the front face;
production of at least one support, of which at least one first end is anchored to the substrate such that part of the support is located on the portion of sacrificial material, the support comprising at least one portion of piezoelectric material located between two electrodes;
production of at least one electrical connection element on said part of the support;
elimination of the portion of sacrificial material, releasing said part of the support such that the portion of piezoelectric material is capable of moving said part of the support in two directions, approximately perpendicular to the front face depending on a value of an electrical voltage intended to be applied to the electrodes.

The method may also comprise the production of several superposed dielectric layers located on the substrate and forming the front face of the electrical connection device, and several electrical interconnection layers located in the dielectric layers and to which at least the electrodes of the first electrical connection element(s) are connected, before the first electrical connection element(s) are produced.

BRIEF DESCRIPTION OF THE DRAWINGS

This invention will be better understood after reading the following description of example embodiments given purely for information and in no way restrictive with reference to the appended drawings in which.

Identical, similar or equivalent parts of the different figures described below have the same numeric references to facilitate the comparison between different figures.

The different parts shown in the figures are not necessarily all at the same scale, to make the figures more easily readable.

The different possibilities (variants and embodiments) must be understood as not being mutually exclusive and they can be combined with each other.

DETAILED PRESENTATION OF PARTICULAR EMBODIMENTS

Figure 1:
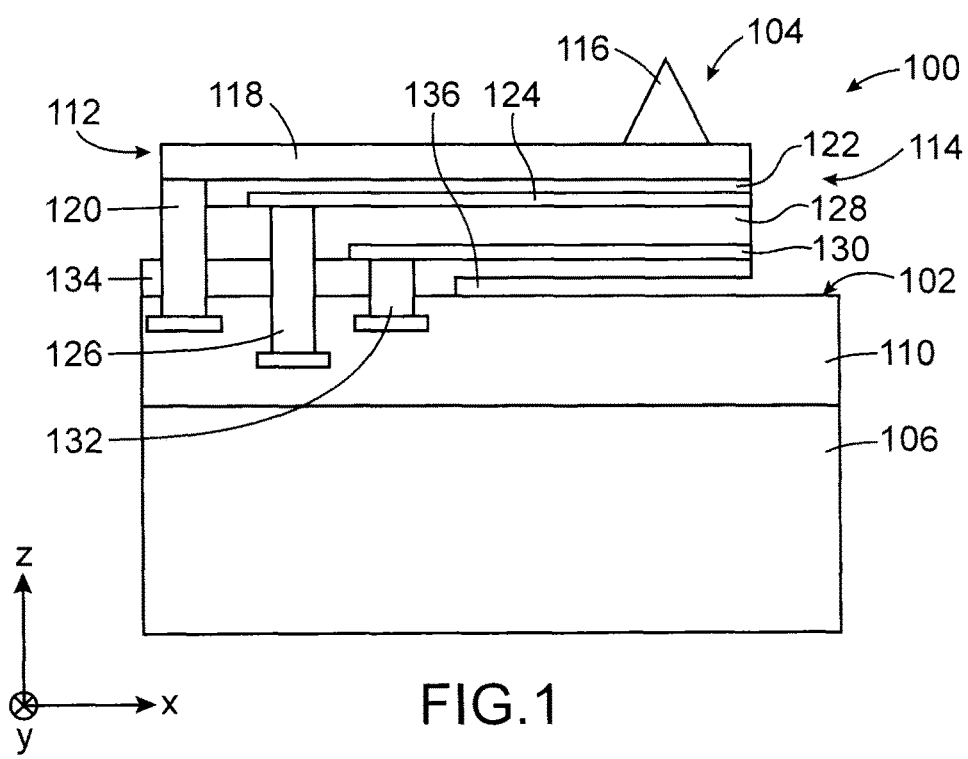
FIGS. 1 to 5 diagrammatically show part of an electrical connection device according to different embodiments.

Refer firstly to FIG. 1 that diagrammatically shows part of an electrical connection device 100 according to a first embodiment. In this first embodiment, the device 100 corresponds to a test card comprising first electrical connection elements 104 on a front face 102 intended to be coupled to contact pads of a tested device. In FIG. 1, only one element 104 is actually shown although the device 100 comprises a number of elements 104 that may for example be equal to several hundred or several thousand or even several tens of thousands, and for example arranged according to a matrix.

The device 100 comprises a substrate 106 for example comprising a semiconductor such as silicon. One or several layers of electrical interconnections (BEOL, or "Back-End Of Line"), not shown in FIG. 1, are arranged on the substrate 106 on the end of the front face 102, and form one or several electrical interconnection levels connected particularly to elements 104, in several dielectric layers 110 comprising at least one inorganic material such as $SiO_2$, SiON, SiN, etc., and deposited on a front face of the substrate 106.

In this case, each element 104 is made in the form of a flexible membrane comprising a first end 112 anchored to the substrate 106 and a second free end 114, in other words not fixed to the substrate 106 in which there is an electrically conducting element 116 corresponding to a test probe or an insert in this first embodiment, intended to or not to be in contact with a contact pad of the tested device depending on the position of the element 104. The element 116 advantageously comprises metal such as copper, tungsten, aluminium, nickel or even rhodium or even a semiconductor covered with metal. The element 116 is intended to be brought into contact with a contact pad of the tested device with a force sufficient to assure mechanical penetration of the element 116 into the contact pad of the tested device. The material(s) used for the element 116 is (are) chosen particularly as a function of the required hardness to form the contact with the contact pad of the tested device, and therefore particularly depending on the fragility of this contact pad.

The element 116 is arranged on an electrically conducting portion 118 in this case elongated in shape and corresponding to an element of the flexible membrane. The portion 118 comprises at least one electrically conducting material such as doped or silicided silicon and/or metal (for example copper, aluminium, tungsten or nickel, or one of those described above for element 116) and/or graphite. The portion 118 is connected to one of the electrical interconnection levels through a first conducting pad 120.

A dielectric portion 122 is located between the portion 118 and a first electrode 124, for example comprising a metal such as titanium. The first electrode 124 is connected to one of the electrical interconnection levels through a second conducting pad 126. The first electrode 124 is located on a portion of piezoelectric material 128, for example comprising PZT and/or AlN, itself located on a second electrode 130. The second electrode 130 is connected to one of the electrical interconnection levels through a third conducting pad 132. The second electrode 130 and the portion 128 are supported on an anchor portion 134, for example made from a semiconductor such as silicon or a dielectric material. The conducting pad 120 is electrically insulated from the anchor portion 134. For example, when the anchor portion 134 contains a semiconductor and the conducting pad 120 is made for example from copper or tungsten, the conducting pad 120 may be surrounded by an electrically insulating material in order to prevent a short circuit between the conducting material of the pad 120 and the anchor portion 134. The anchor portion 134 comprises a first part supported on dielectric layers 110 and thus forms the anchor of the first end 112 of the element 104 to the substrate 106. The conducting pads 120, 126 and 132 pass through this first part of the portion 134. A second part of the portion 134 is not supported on the dielectric layers 110, but is suspended above the front face 102 forming a space 136 between the element 104 and the dielectric layers 110.

When a polarization voltage is applied to the terminals of the electrodes 124, 130 through conducting pads 126 and 132, the portion of the piezoelectric material 128 bends under the effect of the electrostatic polarization, either towards the front face 102 which reduces the gap distance 136 at the second end 114 (there may even be contact between the second end 114 and the front face 102) or in an opposite direction thus increasing the gap distance 136 at the second end 114. Therefore the position of the element 116 along the Z axis (axis oriented perpendicular to the direction along which the membrane formed by the element 104 extends, the Z axis also being perpendicular to the plane formed by the front face 102) depends on the value of the polarization voltage applied to the terminals of the electrodes 124, 130. Therefore, the element 116 may be positioned in one of at least three different positions: a first low position when the membrane deflects towards the substrate 106, a second intermediate position when no polarization voltage is applied to the terminals of electrodes 124, 130 (case shown in FIG. 1), and a third high position when the membrane deflects away from the substrate 106. Thus, when the element 116 is intended to be in contact with a contact pad of the tested device, this element 116 may be configured in the high position. When the element 116 is not intended to be in contact with a contact pad facing the element 116, the element may be left in the intermediate position or it may be configured in the low position to prevent any risk of contact between the element 116 and the contact pad.

Electrical polarization voltages may be applied to the terminals of the electrodes 124, 130 of the elements 104 either through a device external to the device 100 and connected to the electrical interconnection levels of the device 100, or through memory dots formed in the device 100, for example in the dielectric layers 110 and that for example output signals corresponding to polarization voltages to the terminals of electrodes 124, 130.

The elements 116 may be connected to a test system or interface (not shown in FIG. 1) through portions 118, pads 120 and electrical interconnection layers, to inject or trace a signal (voltage or current) from or to the elements 116.

As a variant, each element 104 may comprise an element 116 itself forming multi-points instead of the pointed element 116. Such a multi-probe element is well adapted to making contact with hard rounded contact pads of the tested device, for example metal balls, because in this case contact pads can easily be inserted between the tips of each of the elements 116. The elements 116 are thus well centred relative to the contact pads of the tested device and prevent damage to the contact pads. The distance between the tips of the probes of such an element may for example be less than about 1 µm.

Figure 2:
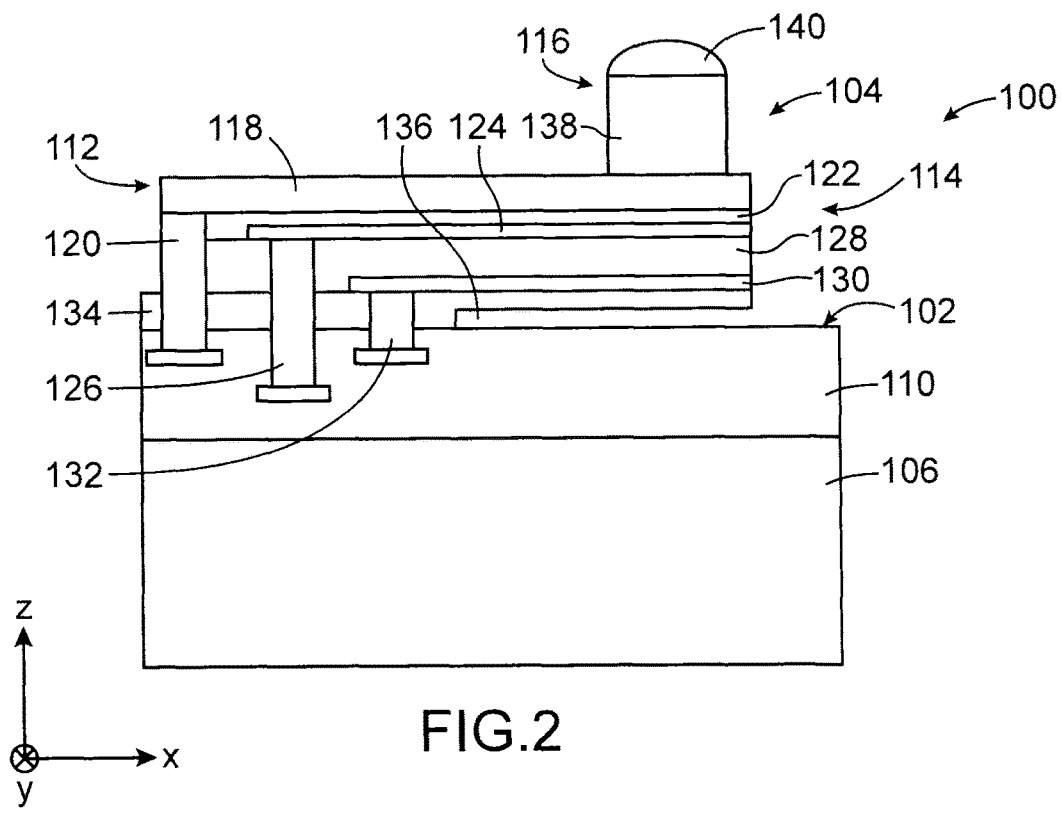

FIG. 2 diagrammatically shows part of a second embodiment of the device 100. As in FIG. 1, although the device 100 comprises several elements 104, only one of these elements 104 is shown in FIG. 2.

Unlike the first embodiment, each element 104 comprises an element 116 replacing the pointed element 116, comprising a portion of electrically conducting material 138 above which there is a conducting portion 140 (that is rounded in FIG. 2 but could be plane). For example, the conducting portion 140 could be made from a creep metal such as SnAg or NiAu, with hardness less than the hardness of the metal forming the pointed or multi-pointed elements 116 used in the first embodiment. The conducting portion 140 may also comprise a harder metal such as tungsten. Such elements 104 are quite suitable for making electrical contact with contact pads of the tested device that are not adapted to a point contact, for example such as copper pads surrounded by an insulation forming a plane surface for example intended to be transferred onto a chip by direct bonding. Such elements 104, are capable of maintaining the integrity of contact pads of the tested device.

Figure 3:
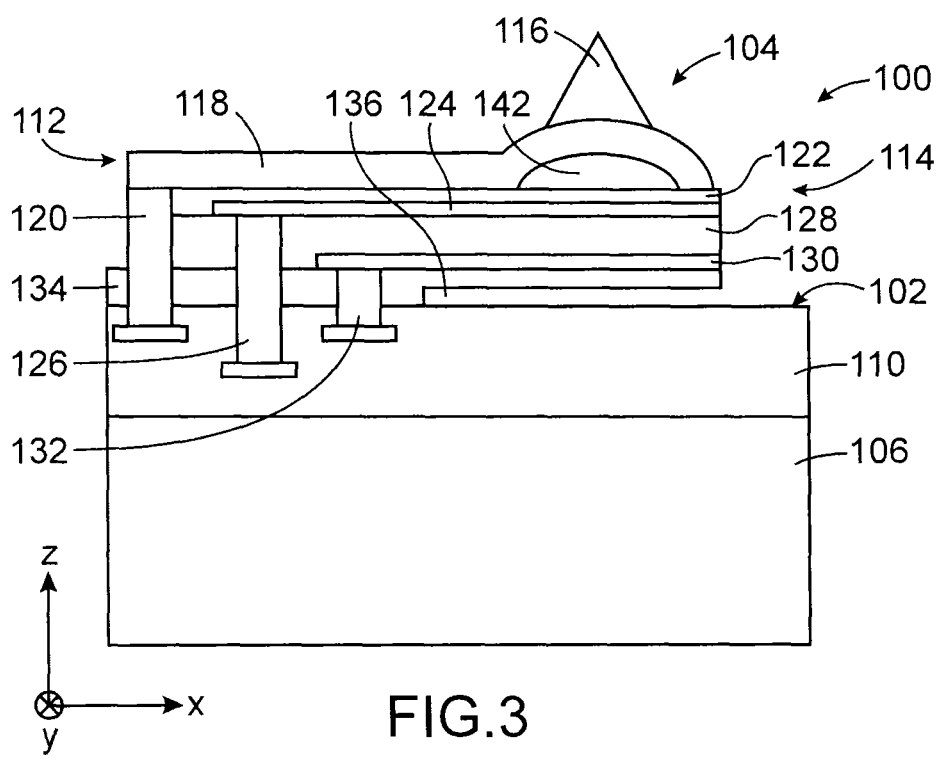

FIG. 3 diagrammatically shows part of the device 100 according to a third embodiment. As shown in FIGS. 1 and 2, although the device 100 comprises several elements 104, only one of these elements 104 is shown in FIG. 3.

In this third embodiment, the portion 118 advantageously comprises doped or silicided silicon. The element 116 in this case is a pointed test probe as in the first embodiment.

In order to achieve some mechanical flexibility with the vertical displacement of the elements 116 despite their small pitch and possible non-uniformity in the height of elements 116 or the contact pads of the tested device, in which elements 116 penetrate into the contact pads of the tested device deep enough to achieve good resistive contact between the elements 116 and the contact pads but not too deep so as to avoid damaging the contact pads and so that the elements 116 can be detached from the contact pads after the test, each element 116 is located on a part of the portion 118 forming a cavity 142 between an upper face of the portion 122 and a lower face of the portion 118 adjacent to the portion 122. In the example in FIG. 3, the cavity 142 comprises a bottom wall formed by the portion 122. The side walls and the top wall of the cavity 142 are formed by the portion 118 supported on the portion 122. Unlike portion 122, the part of the portion 118 forming the walls of the cavity 142 has a convex rounded shape and forms a lid for the cavity 142. In this case the cavity 142 is closed, and the parts of the portion 118 delimiting the cavity 142 are anchored to the portion 122 around the entire periphery of the cavity 142.

Thus, when the elements 116 are brought into contact with the contact pads of the tested device, the portions 118 that resist an excessive force along a direction approximately perpendicular to the front face 102, can be deformed along this direction and thus absorb some of this force. These portions 118 form supports for the elements 116 with good mechanical flexibility (good overdrive).

Off-setting for the deformation in height that can be done by such portions 118, in other words the difference in the maximum height position between two elements 116 of the device 100 may be several tens of microns, for example between about 10 µm and 200 µm. This difference between two adjacent elements 116 may be of the order of a micron or less, for example between about 0.5 µm and 1 µm.

In the example embodiment described above, the portion 118 is made of doped or silicided silicon or more generally an electrically conducting material allowing the portion 118 to have some flexibility. As a variant, the portion 118 may be formed by the superposition of several layers of material, for example a semiconductor covered by a metal layer.

As a variant to this third embodiment, the elements 116 may be made as described above with reference to the second embodiment, or in the form of multi-points.

It is also possible that the cavities 142 are rectangular or square in shape, thus making the portions 118 more flexible when a pressure force is applied to them by the elements 116 in contact with the contact pads of the tested device. As a variant, the shape of the cavities 142 may be other than rectangular.

Figure 4:
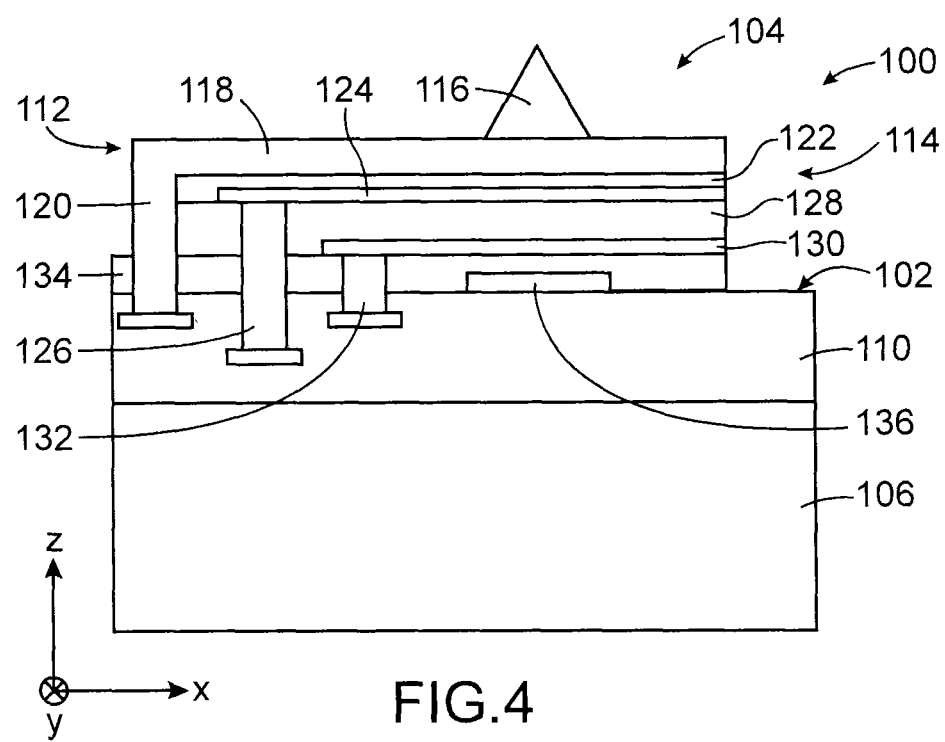

FIG. 4 diagrammatically shows part of the device 100 according to a fourth embodiment. As in the previous figures, although the device 100 comprises several elements 104, only one of these elements 104 is shown in FIG. 4.

Unlike the first embodiment described above, the second end 114 of the element 104 is not free but is anchored to the substrate 106 through a part of the anchor portion 134. The space 136 is present between part of the element 134 (between the two ends 112, 114) and the dielectric layers 110. The element 116 is also located facing the space 136.

In this fourth embodiment, instead of causing a displacement of the second end 114 as in the previous embodiments, deformation of the element 104 will result in concave or convex deformation of the element 104 at the part of the element 104 that is not anchored to the substrate, in other words at the space 136, this deformation depending on the polarization voltage applied to the terminals of electrodes 124, 130.

As a variant to this fourth embodiment, the element 116 may be made as described above with reference to the second embodiment or in the form of a multi-point element. Furthermore, a portion 118 forming a cavity 142 as in the third embodiment may also be used in this fourth embodiment.

In all the previously described embodiments, the device 100 may comprise one or several memory elements 114 coupled to electrodes 124, 130 of elements 104 in order to apply polarization voltages to the terminals of these electrodes 124, 130, values of which are stored in the memory elements 144. For example, it would be possible to have a memory element 144 for each element 104 coupled to this element 104 and outputting a polarization voltage adapted to this element 104 depending on the required displacement for this element 104.

Figure 5:
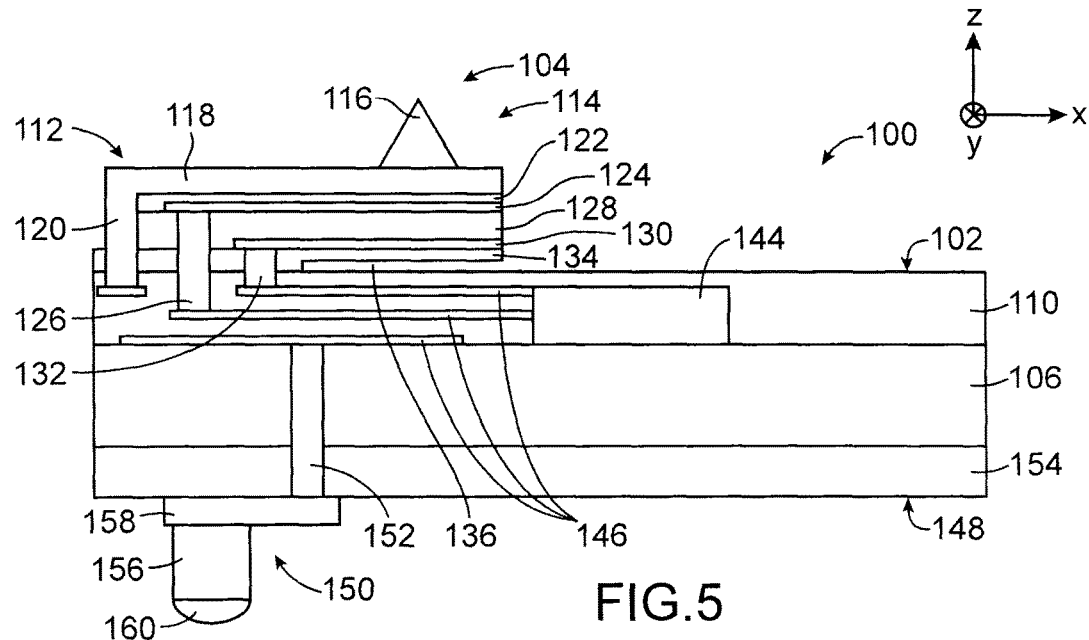

FIG. 5 diagrammatically shows part of the device 100 according to the first embodiment, in which a memory element 144 is connected to the electrodes 124, 130 of the element 104 through electrical interconnection layers 146 (similar to the electrical interconnection layers described in the previous embodiments but not shown) formed in the dielectric layers 110.

The memory elements 144 may correspond to a volatile or non-volatile memory.

The device 100 also comprises second electrical connection elements 150 at a back face 148 (only one element 150 is shown in FIG. 5) electrically connected to the layers 146 through conducting vias 152 passing through the substrate 106 from its front face to its back face, and another dielectric layer 154 located on the back face of the substrate 106 and forming the back face 148 of the device 100. Each element 150 comprises portions of electrically conducting material 156 located on parts of a structured nucleation layer 158 and another portion of electrically conducting material 160 at their tip, for example rounded or flat, for example comprising a creep metal such as SnAg, NiAu or any other appropriate alloy, and for example intended to come into contact with the contact pads of a test interface coupled to the device 100 so that test signals output by the elements 116 can be recorded. For example, the portions 156 and 160 are similar to the portions of element 116 described above with reference to the second embodiment. The thickness of the assembly formed by the substrate 106 and the layers 110, 154 may for example be between about 50 µm and 400 µm.

Elements present at the back face 148 of the device 100 and described above may be present in the device 100 according to the previously described embodiments when the device 100 is intended to be coupled to another device such as a test interface intended to receive/send signals to the elements 104, particularly in the presence of memory elements 144.

In all the previous embodiments, the device 100 may comprise passive devices (capacitors, inductors, resistors) on and/or in the substrate 106, forming one or several circuits that can be used to improve the quality of signals measured by the elements 104, and/or active devices for example including transistors and that can form protective devices for the tested device, for example ESD (Electro-Static Discharge) devices, and/or multiplexing devices and/or digital or analogue processing devices for the measured signals.

FIGS. 6A to 6L show the steps in a method for making the connection device 100 corresponding to that shown in FIG. 1. These figures show and describe the method for making a single first electrical connection element 104 of the device 100.

Figure 6A:
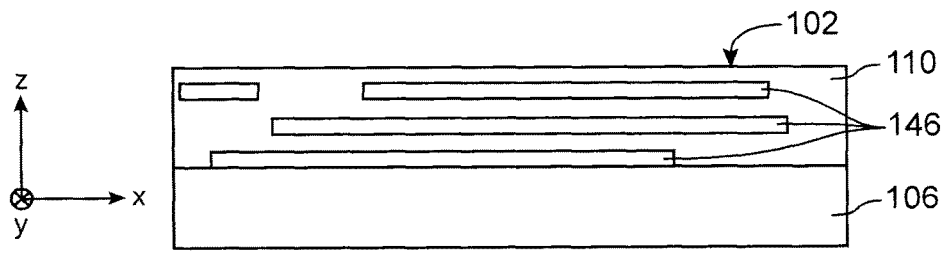
FIGS. 6A to 6L diagrammatically represent steps in a method of making an electrical connection device according to a particular embodiment.

The method is applied from the substrate 106. The electrical interconnection layers 146 and the dielectric layers 110 firstly are made on the front face of the substrate 106, for example through damascene type deposits. These steps also form the front face 102 of the device 100 (FIG. 6A).

Figure 6B:
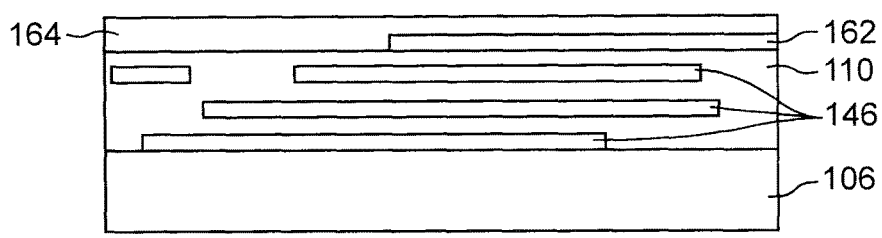

A sacrificial layer that may for example comprise polymer or a resin is then deposited on the front face 102. This sacrificial layer is then structured by etching so that a remaining portion 162 of this layer corresponds to the space 136 intended to be formed between the front face 102 and the element 104. A semiconducting layer 164 is then deposited and intended to form the anchor portion 134 that anchors the element 104 to the substrate 106 (FIG. 6B).

Figure 6C:
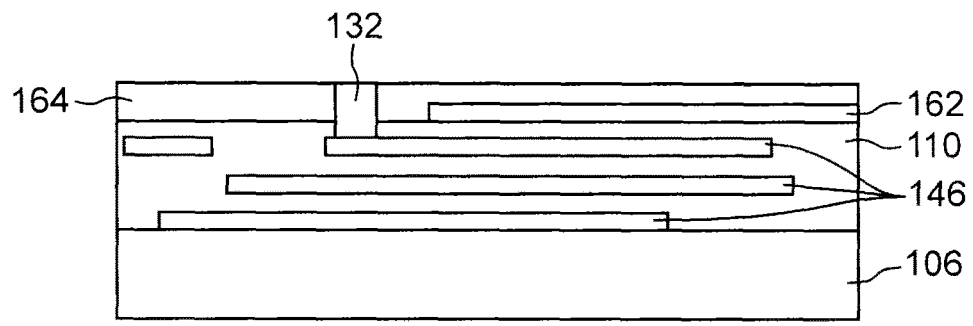

The conducting pad 132 intended to connect the electrode 130 to the electrical interconnection layers 146 is then made. This is done by etching through the layer 164 and the dielectric layers 110 in order to form an access hole to the electrical interconnection layers 146 intended to be connected to the electrode 130. An insulating dielectric layer, for example an SiO$_2$ layer is then deposited on the walls of the hole formed by etching, and a conducting material, for example copper, is then deposited filling the hole. Deposited materials are then planarized stopping on the layer 164 to complete manufacturing of the conducting pad 132 (FIG. 6C).

Figure 6D:
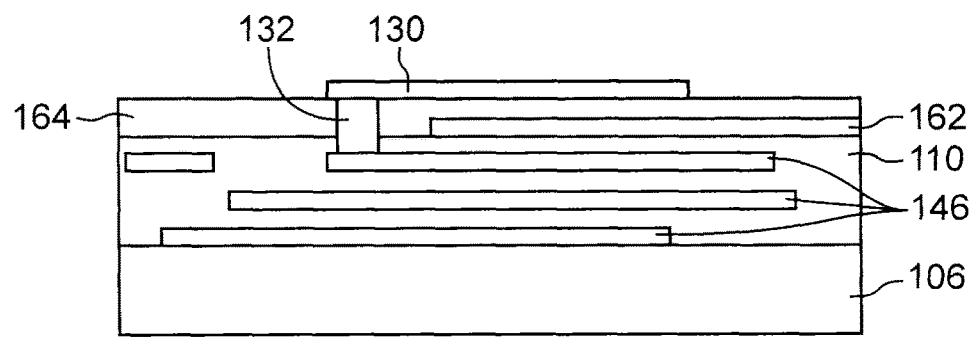

The electrode 130 is then made on the layer 164 and is in contact with the conducting pad 132, through a deposit and structuring of an electrically conducting material (FIG. 6D).

Figure 6E:
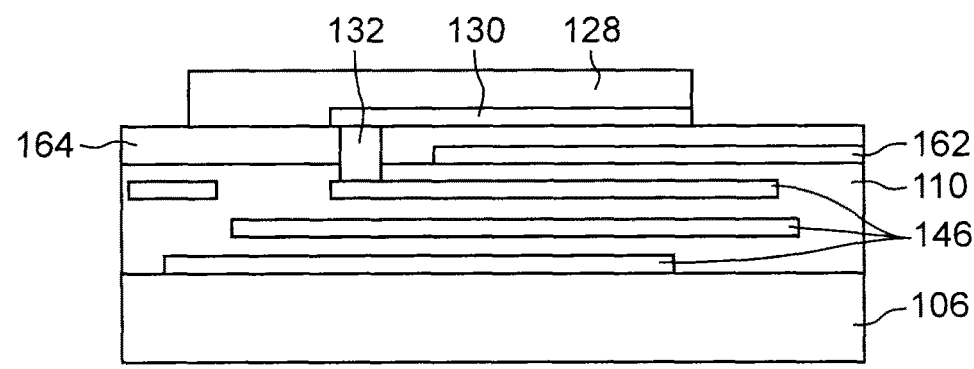

The portion of piezoelectric material 128 is then made on the electrode 130 and on part of the layer 164 by deposition and structuring of the piezoelectric material (FIG. 6E).

Figure 6F:
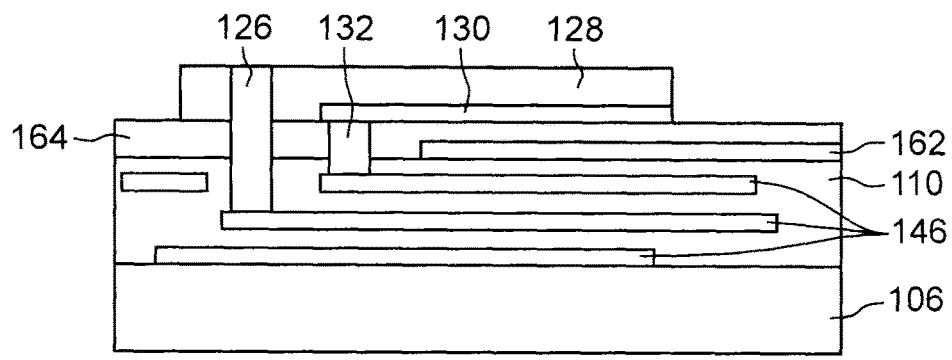

The conducting pad 126 intended to connect the electrode 124 to the electrical interconnection layers 146 is then made. This is done by etching the portion 128, the layer 164 and the dielectric layers 110 so as to form an access to the electrical interconnection layers 146 intended to be connected to the electrode 124. A dielectric insulation layer, for example an SiO$_2$ layer, is then deposited on the walls of the hole formed, and a conducting material for example copper is then deposited filling the hole. The deposited materials are then planarized stopping on the portion 128 in order to complete production of the conducting pad 126 (FIG. 6F).

Figure 6G:
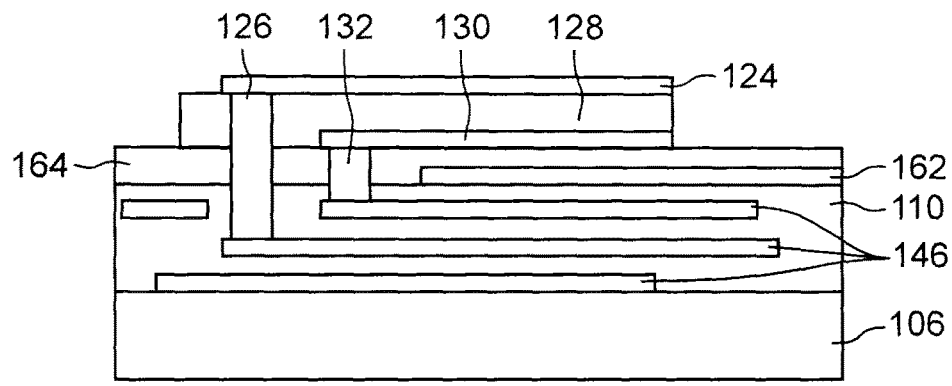

The electrode 124 is then made on the portion 128 and is in contact with the conducting pad 126, through deposition and structuring of an electrically conducting material (FIG. 6G).

Figure 6H:
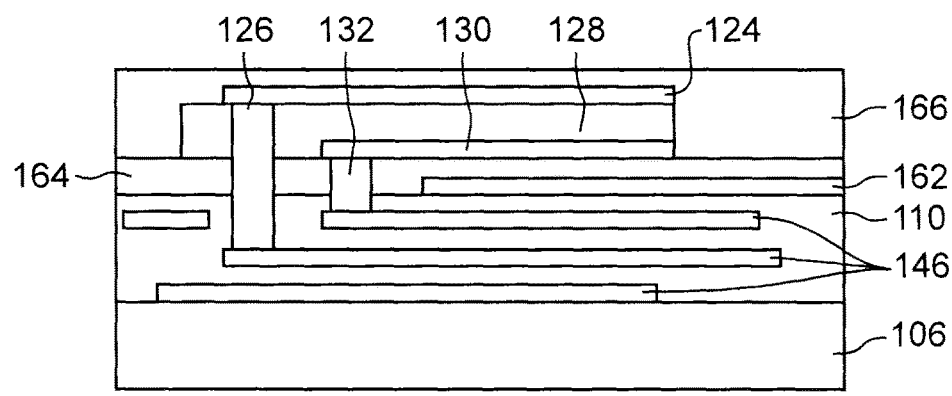
Figure 6I:
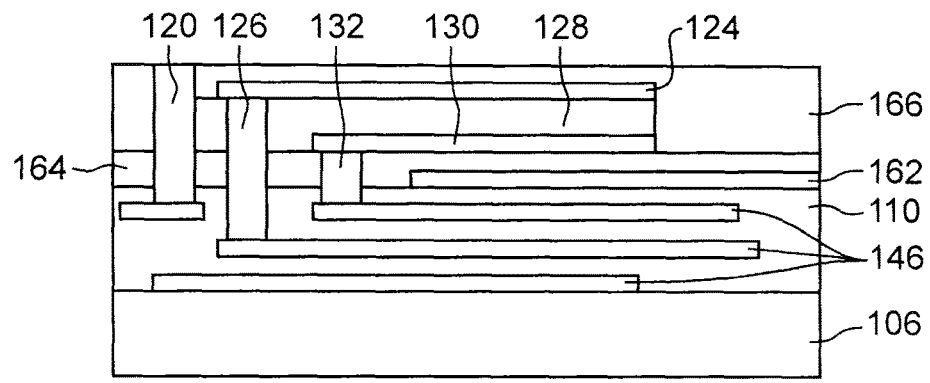

A dielectric layer 166 covering the previously formed structure is then deposited and planarized (FIG. 6H).

Figure 6J:
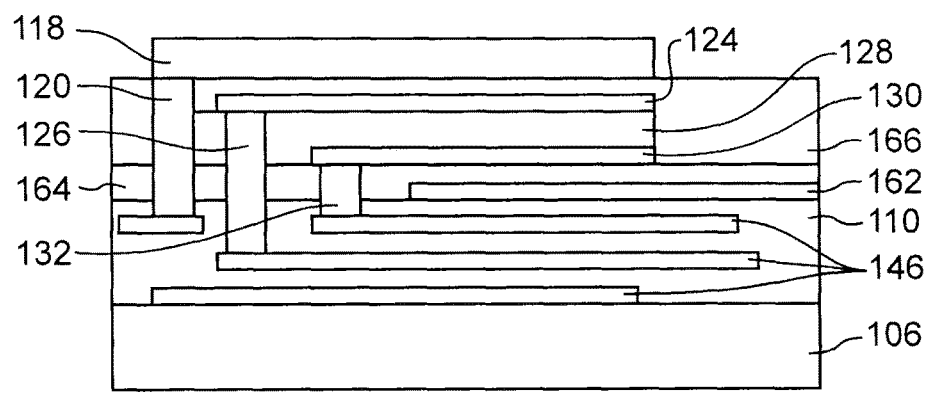

The conducting pad 120 is then made through layers 166, 164 and 110 by the use of steps similar to those used for making the conducting pads 132 and 126 (FIG. 6J).

The conducting portion 118 is then made by deposition and structuring of an electrically conducting material on the dielectric layer 166, and in contact with the conducting pad 120 (FIG. 6J).

Figure 6K:
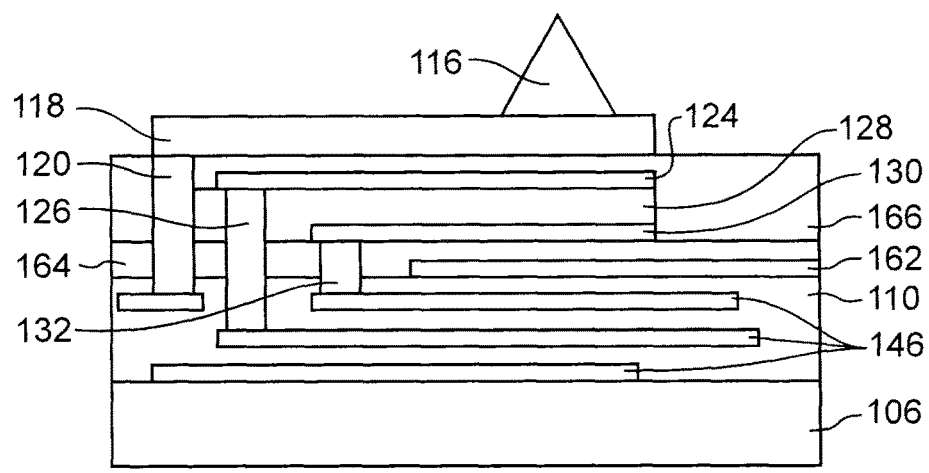

Another deposition and another structuring of an electrically conducting material then make the element 116 on the portion 118 (FIG. 6K).

Figure 6L:
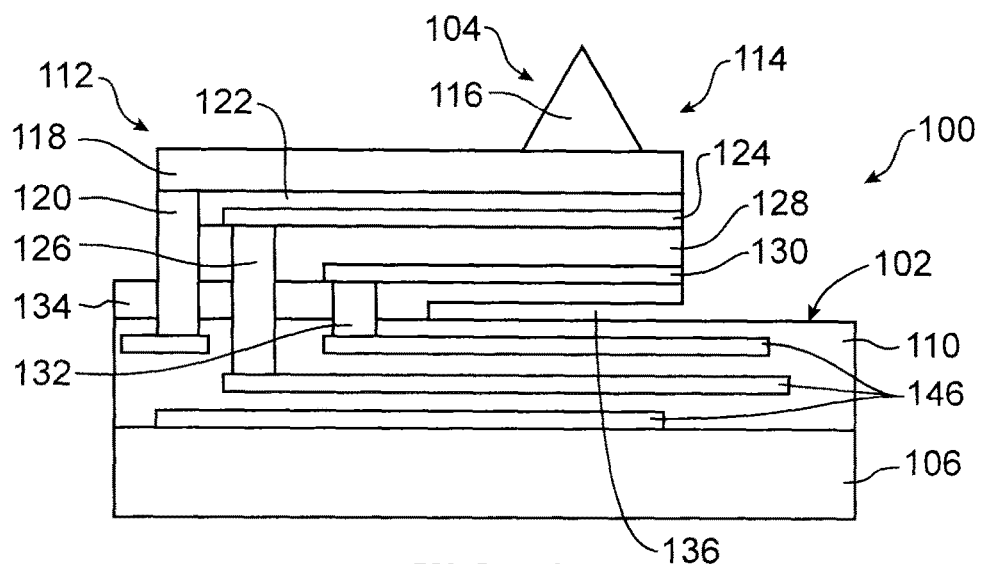

The device 100 is then completed by etching the dielectric layer 166 and the layer 164 such that a remaining part of the layer 164 forms the portion 134 anchoring the element 104 to the substrate 106 at its first end 112, and a remaining part of the layer 166 forms the portion 122 providing electrical insulation between the portion 118 and the electrode 124. The portion of sacrificial material 162 is also etched to form the space 136 and thus release the membrane formed by the element 104 at its second end 114 (FIG. 6L).

When the portion 118 defines a cavity 142 as previously described with reference to FIG. 3, this cavity 142 may be obtained by a deposition of a sacrificial layer on the dielectric layer 166, for example comprising polymer or a resin. This sacrificial layer is then structured by etching such that a remaining portion of this layer corresponds to the volume of the cavity 142 intended to be made. In the case of a sacrificial layer made of polymer, an O$_2$ plasma type etching may be applied to form a polymer portion with a rounded shape to make the cavity 142 as shown in FIG. 3. The rounded shape of the portion of sacrificial material may also be made by reflux. The portion 118 is then made by depositing an electrically conducting layer, for example made of a metal such as Cu, Al, W, Rh, Rt, etc., and/or doped or silicided silicon, covering the remaining portion of the sacrificial layer. This or these electrically conducting layers are then etched so that the remaining portions of this or these layers form the portion 118 and form the lid of the cavity 142. One or several release holes are then made through the lid, and the sacrificial material covered by the portion 118 is then etched through this or these release holes, for example by dry and/or wet etching forming the cavity 142.

In the case of a device comprising vias 152 passing through the substrate 106 as shown in FIG. 5, these vias 152 are made through at least part of the thickness of the substrate 106 at its front face, before the electrical interconnection layers 146 are made. This is done by performing deep etching through the front face of the substrate 106, forming holes through part of the thickness of the substrate 106 and at which vias 152 will be formed. A dielectric insulation layer, for example a $SiO_2$ layer, is then deposited on the walls of the holes, and a bonding and nucleation layer is then deposited on the dielectric insulation layer, for example by an electrolytic deposit. The conducting material of the vias 152, for example copper, is then deposited filling the holes. The substrate 106 may for example be 500 μm or 750 μm thick, and the vias 152 may be made over a height equal to about 100 μm.

Furthermore, when the device 100 comprises second electrical connection elements 150 at its back face 148, as is the case shown in FIG. 5, the structure obtained may be bonded temporarily at its front face 102, to a support forming a mechanical handle. The back face of the substrate 106 is then thinned to the required thickness to be obtained and in particular until the vias 152 are reached. The back face can then be passivated through deposition of the layer 154, and openings are then formed through the layer 154 to contact of the vias 152.

An electrochemical deposition ECD of the nucleation layer 158 is then made on the back face 148, for example by electrolysis. Electrolytic growth then forms the portions 156. The portions 160 are then made by deposition on portions 156. The nucleation layer 158 is then etched to keep only portions forming part of the elements 150. Reflux, if any, can be applied when the material of portions 160 is SnAg, as shown in FIG. 5.

Finally, the device 100 obtained is separated from the temporary handle fixed to the front face 102 of the device 100.

Figure 7:
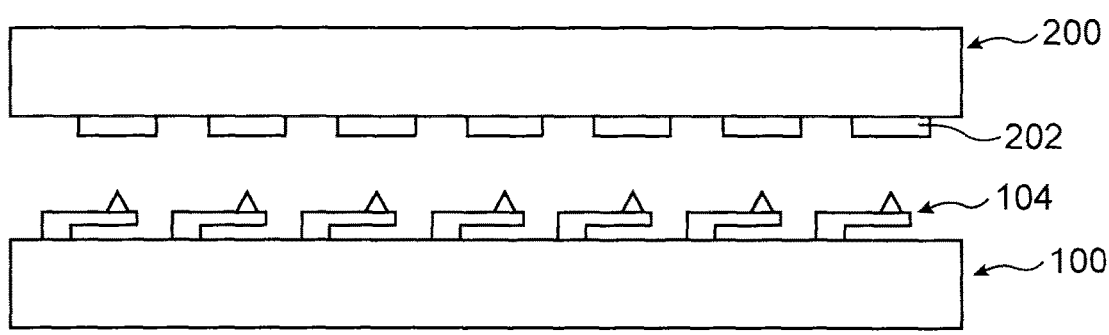
FIG. 7 diagrammatically shows an electrical connection device and an electronic device intended to be tested by the electrical connection device.

FIG. 7 shows the device 100 and the electronic device 200 to be tested. The elements 104 are designed to come into contact with the contact pads 202 of the device 200. The position of each element 104 along the Z axis is defined as a function of the polarization voltage applied to the terminals of the electrodes of each element 104.

The invention claimed is:

1. An electrical connection device comprising:
   at least one substrate; and
   one or several first electrical connection elements located on a front face of the electrical connection device to be coupled to contact pads of an electronic device to which the electrical connection device is to be connected, each first electrical connection element including
      at least one support, of which at least one first end is anchored to the substrate such that part of the support is suspended above the front face forming a space between at least part of the first electrical connection element and at least part of the front face, the support comprising at least a portion of piezoelectric material located between two electrodes such that said part of the support is movable in two directions approximately perpendicular to the front face depending on a value of an electrical voltage that is to be applied onto the electrodes; and
      at least one electrical conducting element located on said part of the support.

2. The electrical connection device according to claim 1, wherein the first electrical connection elements are arranged according to a matrix with a pitch of less than about 100 μm.

3. The electrical connection device according to claim 1, wherein the support of each first electrical connection element is elongated in shape and extends in a direction approximately parallel to the front face.

4. The electrical connection device according to claim 1, wherein the electrically conducting element in each first electrical connection element is located at a second end of the support suspended above the front face.

5. The electrical connection device according to claim 1, wherein a second end of the support is anchored to the substrate in each first electrical connection element, said part of the support suspended above the front face being located between the first end and second end of the support.

6. The electrical connection device according to claim 1, wherein each electrically conducting element comprises at least one portion of electrically conducting material of which one end forms one or several probes, each probe being rounded or plane or pointed.

7. The electrical connection device according to claim 1, wherein the support for each first electrical connection element also comprises at least one anchor portion such that a first electrode of the two electrodes is located between said anchor portion and the portion of piezoelectric material, the anchor portion anchoring the support to the substrate.

8. The electrical connection device according to claim 1, wherein the support of each first electrical connection element comprises at least one electrically conducting portion on which the electrically conducting element is located.

9. The electrical connection device according to claim 8, wherein the support of each first electrical connection element also comprises at least one dielectric portion located between the electrically conducting portion and a second electrode of the two electrodes.

10. The electrical connection device according to claim 8, further comprising at least one electrically conducting via passing through the substrate and connected to the electrically conducting portion of the support of each first electrical connection element and to at least one second electrical connection element located on a back face of the electrical connection device.

11. The electrical connection device according to claim 8, wherein the electrically conducting portion of the support of each first electrical connection element forms a cover of at least one cavity located in the support, the electrically conducting element possibly being located above the cavity.

12. The electrical connection device according to claim 1, further comprising:
   several dielectric layers superposed and arranged on the substrate and forming the front face of the electrical connection device, and
   several electrical interconnection layers located in the dielectric layers and to which at least the electrodes of each first electrical connection element are connected.

13. The electrical connection device according to claim 1, further comprising at least one memory configured to store the value of the electrical voltage intended to be applied to the electrodes of each first electrical connection element.

14. A method for making an electrical connection device, including producing one or several first electrical connection elements from a substrate on a front face of the electrical connection device to be coupled to contact pads of an electronic device to which the electrical connection device is to be connected, the method comprising:
   producing at least one portion of sacrificial material on the front face;
   producing at least one support, of which at least one first end is anchored to the substrate such that part of the support is located on the portion of sacrificial material, the support comprising at least one portion of piezoelectric material located between two electrodes;

producing at least one electrical connection element on said part of the support; and eliminating the portion of sacrificial material, releasing said part of the support such that the portion of piezoelectric material is configured to move said part of the support in two-directions, approximately perpendicular to the front face depending on a value of an electrical voltage intended to be applied onto the electrodes, the part of the support being suspended above the front face forming a space between at least part of the first electrical connection element and at least part of the front face.

15. The method according to claim 14, further comprising producing several dielectric layers superposed and located on the substrate and forming the front face of the electrical connection device, and several electrical interconnection layers located in the dielectric layers and to which at least the electrodes of the first electrical connection element(s) are connected, before producing the first electrical connection element(s).

* * * * *